United States Patent [19]
Carnes

[11] 3,864,722
[45] Feb. 4, 1975

[54] RADIATION SENSING ARRAYS

[75] Inventor: James Edward Carnes, Cranbury, N.J.

[73] Assignee: RCA Corporation, New York, N.Y.

[22] Filed: May 2, 1973

[21] Appl. No.: 356,323

[52] U.S. Cl. .......... 357/24, 357/15, 357/19, 250/370
[51] Int. Cl. .......... H01l 11/00, H01l 15/00
[58] Field of Search .... 250/370; 317/235 G, 235 N, 317/235 UA; 313/65 AB

[56] References Cited
UNITED STATES PATENTS

| | | | |
|---|---|---|---|
| 3,739,240 | 6/1973 | Krambeck | 317/235 |
| 3,757,123 | 9/1973 | Archer et al. | 317/235 |

*Primary Examiner*—Andrew J. James
*Attorney, Agent, or Firm*—H. Christoffersen; S. Cohen

[57] ABSTRACT

A radiation sensing array includes two semiconductor layers of different conductivity types with a large area semiconductor junction therebetween. One of the layers is relatively thin and a substantially transparent metal layer located on the radiation receiving surface thereof forms a Schottky barrier therewith. Surface charge accumulation electrodes are coupled to the opposite surface of the body. The carriers generated at the Schottky barrier in response to a radiation image projected thereon travel through the junction and second layer and accumulate at the surface of the second layer as minority-carrier, surface-charge signals.

9 Claims, 5 Drawing Figures

RADIATION SENSING ARRAYS

There is a need in the area imager art, especially in certain regions of the infrared spectrum, for an image sensing array which is sensitive to radiation, which is relatively efficient, and which may be built using relatively simple fabrication techniques. The arrays of the present invention are designed to meet this need.

The invention is illustrated in the drawing of which:

Figure 1:
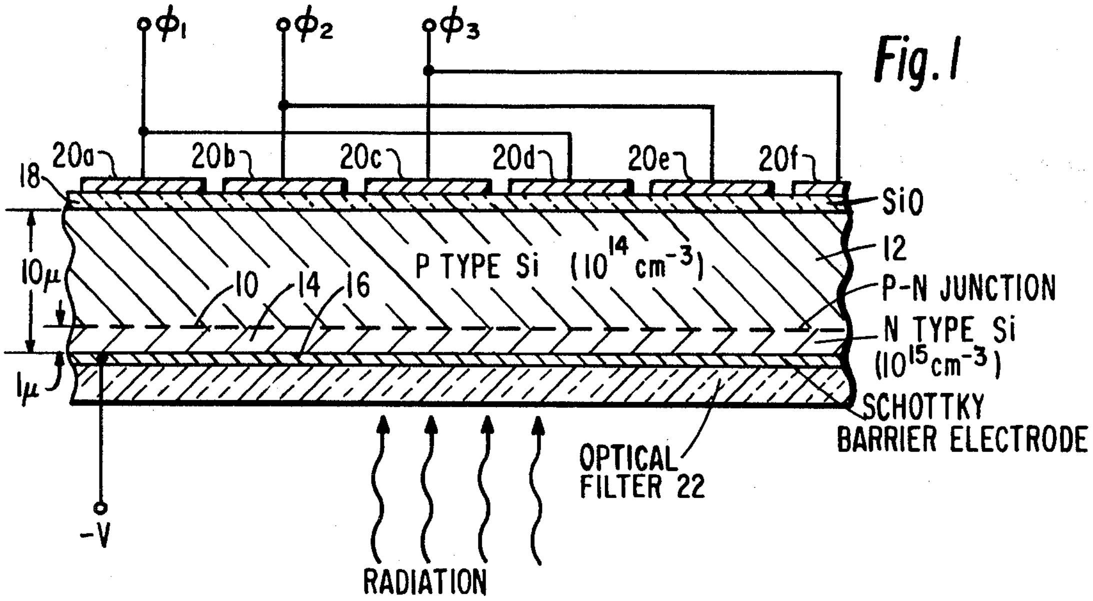
FIG. 1 is a cross section through a portion of a radiation sensing array according to one embodiment of the invention.

The array of FIG. 1 includes a PN junction 10 formed between P type silicon 12 and N type silicon 14. The P type silicon may have an impurity concentration of say $10^{14}$ $cm^{-3}$ and the N type silicon an impurity concentration of $10^{15}$ $cm^{-3}$. The N type silicon is preferably formed by ion implantation techniques.

A substantially transparent metal electrode 16, formed of a material such as gold, is located on the radiation receiving surface of the N type region of the substrate. This metal electrode forms a Schottky barrier with the N type semiconductor substrate. The thickness of the metal must be such that a reasonable proportion of the photons reaching the metal can cause majority carriers (electrons in the case of the N type silicon illustrated) to be excited into the N type silicon, but not so thin that too many photons will pass right through the metal layer without losing their energy. Such a thickness is one of the order of, or less than, the electron-phonon means free path and for a material such as gold a suitable thickness is of the order of 300 Angstroms (A).

A silicon dioxide ($SiO_2$) layer 18, perhaps 1,000 to 2,000 A thick, is located on the opposite surface of the substrate, that is, on the surface of the P type region. Its purpose is to insulate the metal plates 20*a*, 20*b* and so on from the substrate surface. The array also may include an optical filter, shown schematically at 22, over the metal electrode 16, to absorb at least some of those portions of the radiation spectrum not of interest.

In the operation of the array of FIG. 1, during the integration time, that is, during the time a radiation image is being received and stored, a potential difference must exist between the conductive film 16 and the substrate and also potentials must be applied to the electrodes 20. The voltage $-V$ applied to the metal film 16 must be such that the Schottky barrier is sufficiently reverse biased, relative to the electrodes 20 on the surface of the P layer, to entirely deplete the two semiconductor layers, as indicated in the energy band diagram of FIG. 2. That is to say, the potential $-V$ must be sufficiently negative to cause the donor sites in the N type region 14 completely to give up the carriers (electrons) formerly present at these sites and the acceptor sites to give up their carriers (holes) in the P type region. This removes the potential barrier which would otherwise be present to the photon generated electrons. (Note that in the energy band diagram there is no hill between the two portions of different curvature (representing the N and P regions) of the energy band line, as there would be if the voltage $-V$ were of insufficient amplitude or if the N type layer were too thick). For the dimensions shown, that is, a total substrate thickness of 10 microns ($\mu$) and a N type region one micron thick and for the doping density indicated, typical voltages during the integration time might be $-V = -10$ volts and $\phi_1 = \phi_2 = \phi_3 = +7$ volts (a voltage difference of 17 volts or so).

Figure 2:
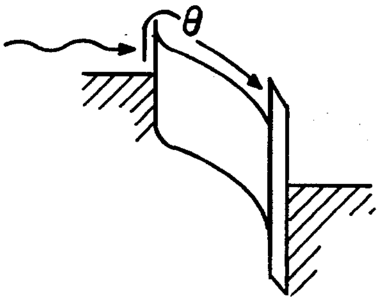
FIG. 2 is an energy band diagram to help explain the operation of the array of FIG. 1.

With the voltages and other parameters as stated above, during the integration time radiation reaching the Schottky barrier causes electrons to be excited to energies above the Fermi level in the metal by an amount equal to the photon energy. Holes also can be created in the metal by exciting a low lying electron to higher energies, leaving behind an unoccupied level. Many of excited electrons, in the case of an N layer, are sufficiently energetic to climb over the potential barrier, as shown in FIG. 2. As the N type region is fully depleted, these electrons do not see a potential hill at the PN junction and travel through the junction and into the P type region. the electrons appear as minority carriers in the P type region and travel into the potential wells located beneath the electrodes 20, where they become stored as surface charge signals.

In general, becuase of the close spacing between the Schottky barrier electrode and the electrodes 20, the potential well at each electrode receives charge carriers mainly generated at the portion of the Schottky barrier directly opposite that electrode. Thus, the charge pattern created represents very closely the radiation pattern reaching the array.

At the termination of the integration time, which may be of the order of 1/30th of a second or so depending upon the image intensity and other factors, the charges accumulated may be shifted out of the array in conventional charge-coupled fashion. That is, the voltages $\phi_1$, $\phi_2$, $\phi_3$ now become three phase voltages which cause the accumulated charges to shift from electrode to electrode to an output structure which may be a diffusion, and from there to a buffer and then to a display device such as a cathode ray tube display. As these circuits are not part of the present invention and are in themselves well known, they will not be dealt with further here.

The period during which the charge-coupled shifting takes place can be very short. In a multiple row array, the information in a row can be shifted out of the array in a period comparable to that employed for horizontal retrace in commercial television. In view of this, $-V$ need not be changed in value during such shifting. However, if the scene is of exceptionally high intensity or if for other reasons it is desired to "shutter" the array either during times other than the integration time or at any other periods, this may be electrically accomplished by reducing the value of $-V$, that is, by making it less negative (making it have a value closer to ground).

The array shown in FIG. 1 is particularly useful for detection of near infrared radiation (radiation at wavelengths greater than 1 micron ($\mu$m)). When radiation in this region of the spectrum is of interest, the optical filter 22 is chosen to absorb major portions of the radiation at higher frequencies. It is to be understood, of course, that this is an example only as, depending upon the choice of metal employed for the Schottky barrier electrode 16, the particular optical filter and other factors, the array of FIG. 1 can be made sensitive to radiation in other regions of the radiation spectrum.

Figure 3:
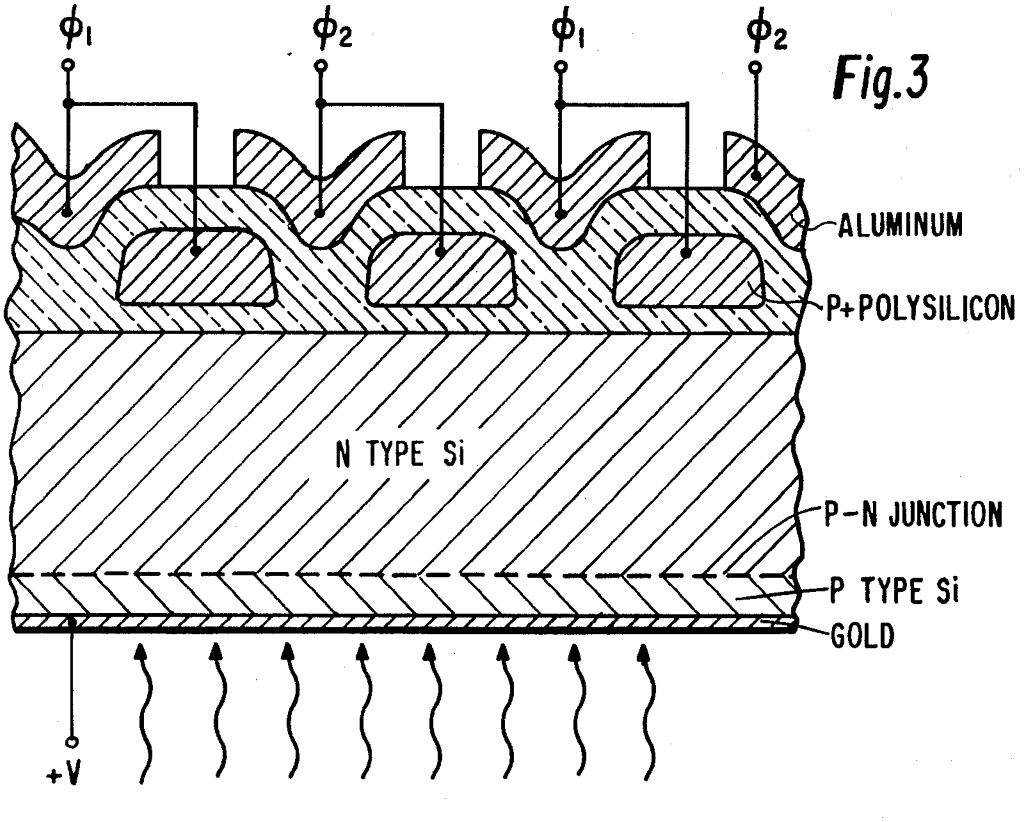
FIG. 3 is a cross section through a portion of a radiation sensing array according to a second embodiment of the invention.

FIG. 3 is for the purpose of illustrating that the invention can employ a relatively thin P type region forming a junction with a N type region of the substrate. It also illustrates that the electrodes can be two-phase rather than three-phase charge coupled structures. The voltages are relatively positive at the Schottky barrier electrode and relatively negative at the charge coupled electrodes. The operation of the FIG. 3 structure is quite analogous to that of FIG. 1 structure; however, the radiation reaching the Schottky barrier electrode now causes holes to drift through the P type silicon region. They pass through the junction and travel as minority carriers in the N type silicon substrate and become stored in the potential wells beneath the charge coupled electrodes as minority carrier surface charge signal.

In both the embodiments of FIGS. 1 and 3 and in all other embodiments of the invention, an aspect of the invention of particular interest is the recognition that the Schottky barrier generates majority charge carriers and these are not compatible with operation of a charge coupled array. The inclusion of the PN junction in the substrate closely adjacent to the Schottky barrier performs the function of translating these majority carriers to minority carriers which are suitable for accumulation as surface charge signals and which can be handled by the charge coupled array.

In the operation of the arrays discussed above for the detection of infrared radiation, the amount of signal intelligence received is generally relatively small compared to the background infrared radiation. This means that the contrast between charge signal in adjacent storage locations beneath electrodes 20 of the array will be relatively small. The array shown schematically in FIG. 4 is for the purpose of dealing with this problem.

Figure 4:
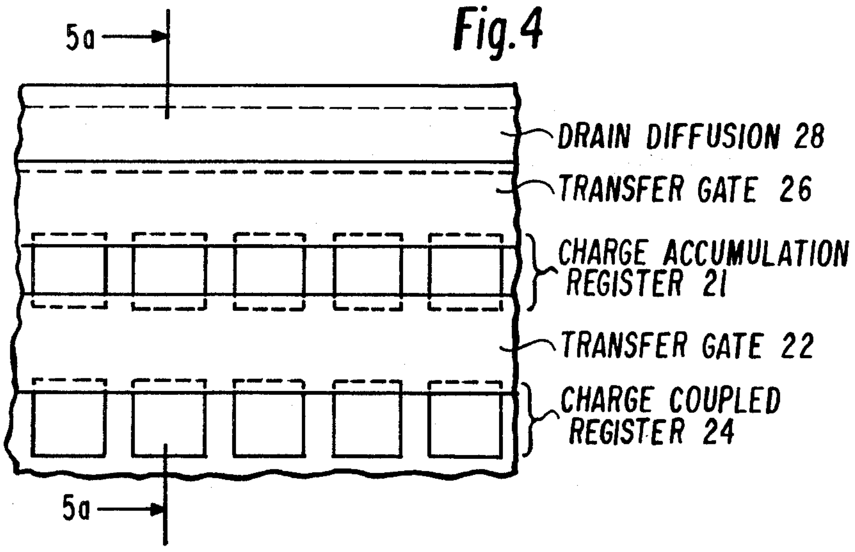
FIG. 4 is a plan view showing in rather schematic fashion a radiation sensing array according to a third embodiment of the invention.

In the array of FIG. 4, the potentials are such that the carriers produced at the Schottky barrier in response to incident radiation are initially accumulated in the charge accumulation register 21 (which corresponds to the registers shown in cross-section in FIGS. 1 and 3). After this register has accumulated charge for the integration time, the transfer gate 22 causes only a small portion of this charge to transfer, in parallel, to the corresponding stages of the charge coupled register 24. After this transfer, the charge may be shifted out of the charge-coupled register, in conventional fashion, and the remaining charge in the accumulation register 21 removed. This may be accomplished by activating the transfer gate 26 and placing a suitable potential on drain bus diffusion 28.

The operation discussed above is analogous to that described in concurrently filed, copending application Ser. No. 356,367, for "Charge Coupled Radiation Sensing Circuit," by Brown F. Williams and Walter Frank Kosonocky, and assigned to the same assignee as the present invention. While the electrode structure in this copending application is somewhat different than that employed here, the principle of "skimming" only a small portion of the surface charge signal from a deep potential well and placing it into the well of a charge-coupled register stage is the same as that in the copending application. The drain bus 28 also may have the function of controlling "blooming" as duscussed in the copending application.

Figure 5:
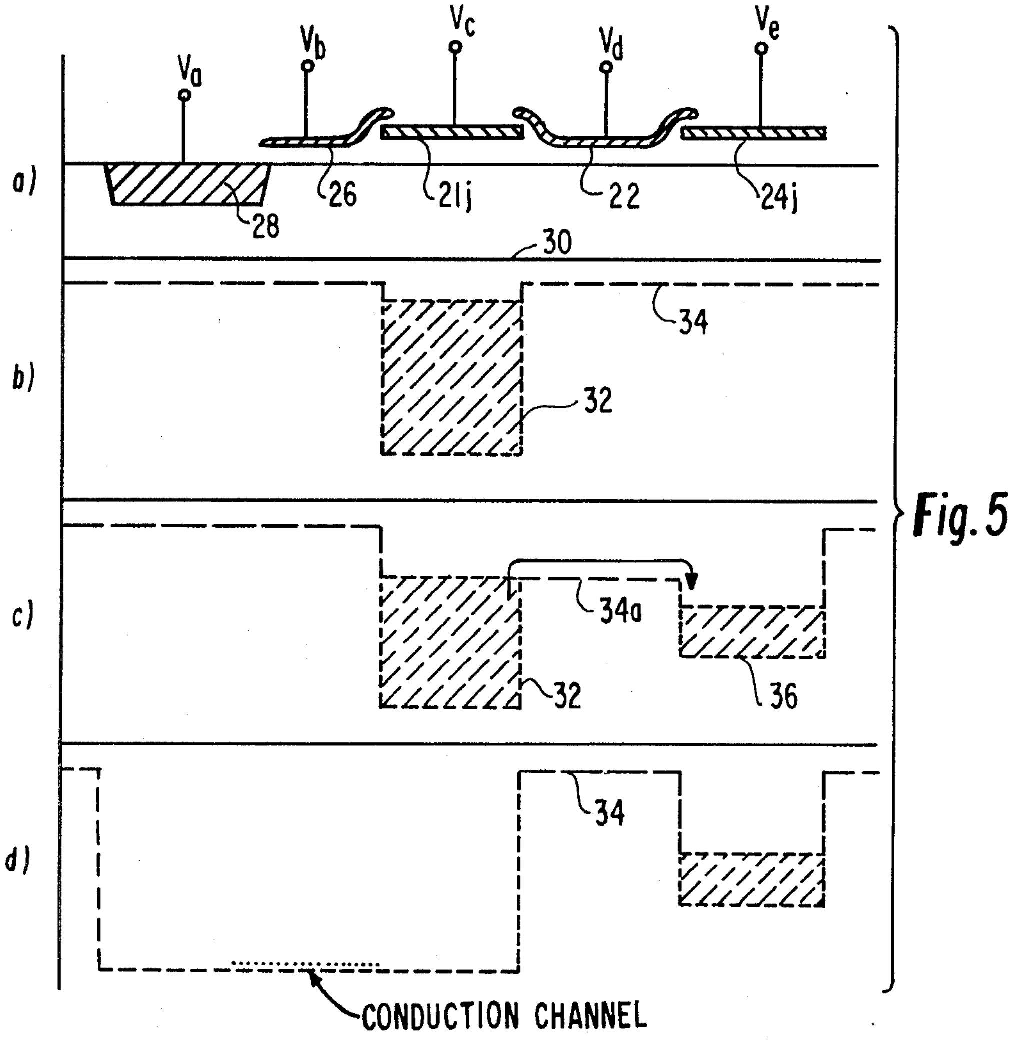
FIG. 5 shows the electrode structure of FIG. 4 somewhat more realistically than in FIG. 4, and shows also the surface potential profiles which exist during the operation of the array.

FIG. 5 shows the electrodes of FIG. 4 in a somewhat more realistic way and shows also the surface potential profiles. Each electrode in FIG. 5*a* is identified by a number corresponding to the one used in FIG. 4 in some cases followed by a *j* (in cases where more than one electrode makes up a structure). The letter *j* is intended to indicate the *j*'th location.

During the integration time, the Schottky barrier electrode (not shown in FIGS. 4 or 5) but located at the image receiving surface of the array just as in FIGS. 1 and 3, is maintained at a suitable reverse bias potential. The charge accumulation electrode 21*j* is maintained at a suitable potential to cause the potential well shown in FIG. 5*b* to form. Assuming materials of the type shown in FIG. 1, the Schottky barrier electrode may be at a potential of −10 volts and the charge accumulation electrode 21*j* at a potential of +7 volts. The photon induced electrons pass through the PN junction corresponding to 10 of FIG. 1, and through the P type silicon and become stored at the P type silicon surface (30 in FIG. 5B) beneath electrode 21*j*. This accumulation of surface charge is shown as a cross-hatched, dashed area within the potential well 32 in FIG. 5*b*. During this period, the transfer gate 22 is maintained at a potential of perhaps +1 volt or so to maintain a potential barrier at 34. This barrier prevents any of the accumulated charge from passing to the charge-coupled register electrode 24j.

After the integration interval, the voltage $V_d$ applied to the transfer gate 22 is set to a more positive, accurately known reference level (such as +3 volts), causing the potential barrier 34 to be lowered as indicated at 34*a* in FIG. 5*c*. At the same time, the potential $V_d$ applied to the charge coupled register gate 24*j* is made more positive, say to the extent of +5 volts or so. This causes a potential well 36 to form beneath electrode 24*j*. The result of these actions is to cause a small portion of the charge accumulated in potential well 32 to pass over the lowered potential hill 34a and to accumulate in the potential well 36. A fixed amount of the charge which has accumulated remains in the potential well 32.

FIG. 5*d* illustrates the next step in the operation. The voltage $V_d$ applied to the transfer gate 22 is made less positive, that is, it is returned to a value of +1 volt or so. This causes the potential barrier 34 again to form to isolate the charge-coupled register 24 from the charge accumulation register 21. The blooming bus diffusion 28 is now made highly positive, say to the extent of +7 to +10 volts, or so, and the transfer gate 26 is made highly positive to cause a conduction channel to form between the blooming bus diffusion 28 and the potential well 32. The result is that the charge remaining in the potential well 32 flows through the conduction channel and to the drain bus 28, which bus acts as current sink. The potential well 32 is thus emptied of charge and free to start accumulation again. Immediately before the next integration time, the potentials $V_a$, $V_b$ and $V_e$ are returned to their original values so that the potential profile at the substrate surface returns to that shown in FIG. 5*a*.

Any time after the transfer gate 22 is returned to its original potential, as indicated in FIG. 5*b*, the charge accumulated in the charge coupled register 24 may be shifted out of the register by the application of suitable multiple phase voltages to the charge coupled electrodes. The charge-coupled electrode structure is shown only schematically and in practice may be as shown in FIG. 3 or as shown in FIG. 1.

While the FIG. 4 circuit has been described in terms of a substrate which is mainly of P type and in which there is a thin N type region adjacent to the Schottky barrier electrode, it is of course to be understood that the FIG. 4 system can be implemented with the alternative configuration as shown in FIG. 3. It is also to be understood that the various parameters given and the various materials given for these and the other embodiments of the invention are only for purposes of illustration. the principles of the invention are equally operative with suitable substitution of other insulating materials, other substrate materials, other Schottky barrier materials and so on. Some examples of suitable Schottky barrier metal-semiconductor combinations for different regions of the spectrum are given in V. L. Dalal, "Analysis of Photoemissive Schottky Barrier Photodetectors" J. App. Phys. 42, 6, 2280 (May 1971). This article also gives details of suitable optical filters and the principles governing their use.

What is claimed is:

1. A radiation sensing array comprising, in combination:

a semiconductor substrate having a radiation receiving surface and an opposite surface and comprising a relatively thin semiconductor region of one conductivity type adjacent to said radiation receiving surface forming a junction with a relatively thicker semiconductor region of different conductivity type located between said junction and said opposite surface;

a relatively transparent, relatively thin metal film on said radiation receiving surface and forming a Schottky barrier therewith;

a plurality of electrode means at said opposite surface for creating surface potentials thereat for the accumulation, at a plurality of locations, of minority charge carriers; and means for reverse biasing said Schottky barrier at a level sufficient to deplete both semiconductor layers, whereby when radiation excitation is applied to said metal film, photoexcited majority charge carriers pass through said relatively thin semiconductor region and junction and appear as minority carriers in the relatively thicker semiconductor region, which may be collected as surface charge signals at said opposite surface.

2. An array as set forth in claim 1 wherein said plurality of electrode means comprises a chargecoupled shift register.

3. An array as set forth in claim 1, further including:

charge-coupled shift register means; and means for shifting a portion of any charge signals which are collected in response to radiation excitation into the stages of said shift register means.

4. An array as set forth in claim 1 wherein said means for shifting comprises means for shifting only that portion of any charge signal which is collected which is of greater than a given amplitude.

5. A radiation sensing array comprising, in combination:

a semiconductor substrate having a radiation receiving surface and an opposite surface and comprising a relatively thin semiconductor region of one conductivity type adjacent to said radiation receiving surface forming a junction with a relatively thicker semiconductor region of different conductivity type located between said junction and said opposite surface;

a relatively transparent, relatively thin metal film on said radiation receiving surface and forming a Schottky barrier therewith;

means for quiescently biasing said metal film at a level to deplete both regions of said substrate; and means at said opposite surface for creating a plurality of potential wells at said surface, each for the collection of a surface charge signal produced in response to radiation excitation reaching the portion of the metal film and opposite said well.

6. A radiation sensing array as set forth in claim 5 wherein said means for creating a plurality of potential wells comprises a plurality of electrodes, each insulated from and electrically coupled to said opposite surface of said substrate.

7. A radiation sensing array as set forth in claim 6 wherein said plurality of electrodes are located one adjacent to another and form the stages of a charge-coupled shift register.

8. A radiation sensing array as set forth in claim 5 wherein said relatively thin semiconductor has a thickness of not more than 1 micron.

9. A radiation sensing array as set forth in claim 8 wherein said substrate has a total thickness of about 10 microns.

* * * * *